(12) United States Patent
Hamaba et al.

(10) Patent No.: US 9,578,965 B2
(45) Date of Patent: Feb. 28, 2017

(54) FIXING DEVICE, FIXING STRUCTURE OF APPARATUS, AND FIXING METHOD OF APPARATUS

(71) Applicant: FUJI XEROX CO., LTD., Tokyo (JP)

(72) Inventors: Keijiro Hamaba, Kanagawa (JP); Akira Harada, Kanagawa (JP); Kenichiro Yano, Kanagawa (JP); Hirotake Eguchi, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 96 days.

(21) Appl. No.: 14/490,174

(22) Filed: Sep. 18, 2014

(65) Prior Publication Data

US 2015/0245711 A1    Sep. 3, 2015

(30) Foreign Application Priority Data

Mar. 3, 2014  (JP) .................................. 2014-040206

(51) Int. Cl.
| | | |
|---|---|---|
| *F16M 11/20* | (2006.01) | |
| *A47B 91/08* | (2006.01) | |
| *G03G 21/16* | (2006.01) | |
| *A47B 91/02* | (2006.01) | |
| *F25D 25/00* | (2006.01) | |

(Continued)

(52) U.S. Cl.
CPC ............... *A47B 91/08* (2013.01); *A47B 91/02* (2013.01); *F25D 25/00* (2013.01); *G03G 21/1619* (2013.01); *H04N 9/31* (2013.01); *H05K 5/0234* (2013.01); *F25D 23/00* (2013.01)

(58) Field of Classification Search
USPC .................................................... 248/188.8
See application file for complete search history.

(56) References Cited

U.S. PATENT DOCUMENTS 1,450,183 A * 4/1923 Moon .................... A47B 21/04
                                                    248/680
2,304,311 A * 12/1942 Luce .................... B60Q 1/0433
                                                    248/309.1

(Continued)

FOREIGN PATENT DOCUMENTS

JP    U-60-187181    12/1985
JP    U-3-88011      9/1991

(Continued)

OTHER PUBLICATIONS

English translation of Office Action issued in Japanese Patent Application No. 2014-040206 mailed Apr. 30, 2004.

*Primary Examiner* — Monica Millner
(74) *Attorney, Agent, or Firm* — Oliff PLC (57) ABSTRACT

Provided is a fixing device including an engaging member that includes a hook portion that is inserted into a hole provided in the apparatus and is hooked to an edge of the hole, and is configured of a planar member, a fixing portion that is fixed to the engaging member and is fixed to an installation surface on which the apparatus is installed, and a closing portion that is fixed to the engaging member so that a position of the closing portion is adjustable, closes the hole by being inserted into the hole, and is configured of the planar member, wherein the engaging member is fixed to the fixing portion so that a position of the engaging member is adjustable, and wherein the hook portion and the closing portion are disposed between the plural grooves.

20 Claims, 6 Drawing Sheets

(51) Int. Cl.
*H04N 9/31* (2006.01)
*H05K 5/02* (2006.01)
*F25D 23/00* (2006.01)

(56) References Cited

U.S. PATENT DOCUMENTS

| | | | | |
|---|---|---|---|---|
| 4,211,178 A * | 7/1980 | Peterson | ............... | D05B 75/06 |
| | | | | 112/217.1 |
| 4,275,939 A * | 6/1981 | Odermann | ............ | D05B 75/02 |
| | | | | 112/258 |
| 4,645,166 A * | 2/1987 | Checkley | ........... | B60N 2/01558 |
| | | | | 248/503.1 |
| 5,131,621 A * | 7/1992 | Sdano | ..................... | F16M 7/00 |
| | | | | 248/500 |
| 5,624,098 A * | 4/1997 | McDowell | ............... | F24C 3/12 |
| | | | | 248/188.8 |
| 5,699,993 A * | 12/1997 | Hill | ......................... | H02B 1/54 |
| | | | | 248/316.5 |
| 6,409,129 B1 * | 6/2002 | Chen | .................... | A47B 91/024 |
| | | | | 248/188.8 |
| 7,484,707 B2 | 2/2009 | Lee | ...................... | A47B 91/04 |
| | | | | 248/188.5 |
| 7,775,498 B2 * | 8/2010 | Phillips | ............... | A47L 15/4253 |
| | | | | 248/500 |
| 7,900,485 B2 * | 3/2011 | Lee | ...................... | D06F 39/125 |
| | | | | 248/188.8 |
| 8,056,894 B2 * | 11/2011 | Ichikawa | ........... | G03G 15/6511 |
| | | | | 271/10.01 |
| 9,163,842 B2 * | 10/2015 | Adams | .................... | A47B 91/02 |
| 2002/0014573 A1 * | 2/2002 | Anderson | ................ | F16M 7/00 |
| | | | | 248/677 |
| 2002/0139909 A1 * | 10/2002 | Oyama | .................. | A47B 91/02 |
| | | | | 248/188.8 |
| 2003/0025051 A1 * | 2/2003 | MacDonald | ........... | A47B 91/16 |
| | | | | 248/188.4 |
| 2003/0215304 A1 * | 11/2003 | Natero | ................... | A47B 97/00 |
| | | | | 411/107 |
| 2005/0116134 A1 * | 6/2005 | Lee | ........................ | D06F 37/20 |
| | | | | 248/650 |
| 2006/0131466 A1 * | 6/2006 | Cha | ...................... | A47B 91/024 |
| | | | | 248/188.8 |
| 2006/0289709 A1 * | 12/2006 | Yonezawa | ............. | B23Q 3/183 |
| | | | | 248/188.8 |
| 2013/0112822 A1 | 5/2013 | Ishiwata | | |
| 2013/0154464 A1 * | 6/2013 | Fiori | .................... | E05D 7/0423 |
| | | | | 312/405 |
| 2013/0180187 A1 * | 7/2013 | Takeshita | ................. | E04B 1/98 |
| | | | | 52/167.8 |

FOREIGN PATENT DOCUMENTS

| | | |
|---|---|---|
| JP | U-6-60065 | 8/1994 |
| JP | A-9-168445 | 6/1997 |
| JP | A-2002-252475 | 9/2002 |
| JP | A-2008-99961 | 5/2008 |
| JP | A-2008-183201 | 8/2008 |
| JP | A-2008-212328 | 9/2008 |
| JP | A-2008-228933 | 10/2008 |
| JP | A-2010-1144 | 1/2010 |
| JP | A-2010-110338 | 5/2010 |
| JP | A-2010-165952 | 7/2010 |
| JP | A-2010-245252 | 10/2010 |
| JP | A-2011-10691 | 1/2011 |
| JP | A-2013-94519 | 5/2013 |
| JP | A-2013-144042 | 7/2013 |
| JP | A-2013-146337 | 8/2013 |

* cited by examiner

FIXING DEVICE, FIXING STRUCTURE OF APPARATUS, AND FIXING METHOD OF APPARATUS

CROSS-REFERENCE TO RELATED APPLICATIONS

This application is based on and claims priority under 35 USC 119 from Japanese Patent Application No. 2014-040206 filed Mar. 3, 2014.

BACKGROUND

Technical Field

The present invention relates to a fixing device, a fixing structure of an apparatus, and a fixing method of an apparatus.

SUMMARY

According to an aspect of the invention, there is provided a fixing device including:

an engaging member that includes a hook portion that is inserted into a hole provided in the apparatus and is hooked to an edge of the hole, and is configured of a planar member;

a fixing portion that is fixed to the engaging member and is fixed to an installation surface on which the apparatus is installed; and a closing portion that is fixed to the engaging member so that a position of the closing portion is adjustable, closes the hole by being inserted into the hole, and is configured of the planar member, wherein the engaging member is fixed to the fixing portion so that a position of the engaging member is adjustable by plural grooves that are provided on the fixing portion and are parallel to one another and by a fixing member inserted into the groove, and wherein the hook portion and the closing portion are disposed between the plural grooves.

BRIEF DESCRIPTION OF THE DRAWINGS

Exemplary embodiments of the present invention will be described in detail based on the following figures, wherein.

DETAILED DESCRIPTION

Hereinafter, exemplary embodiments of the present invention will be described in detail with reference to the drawings.

Figure 1:
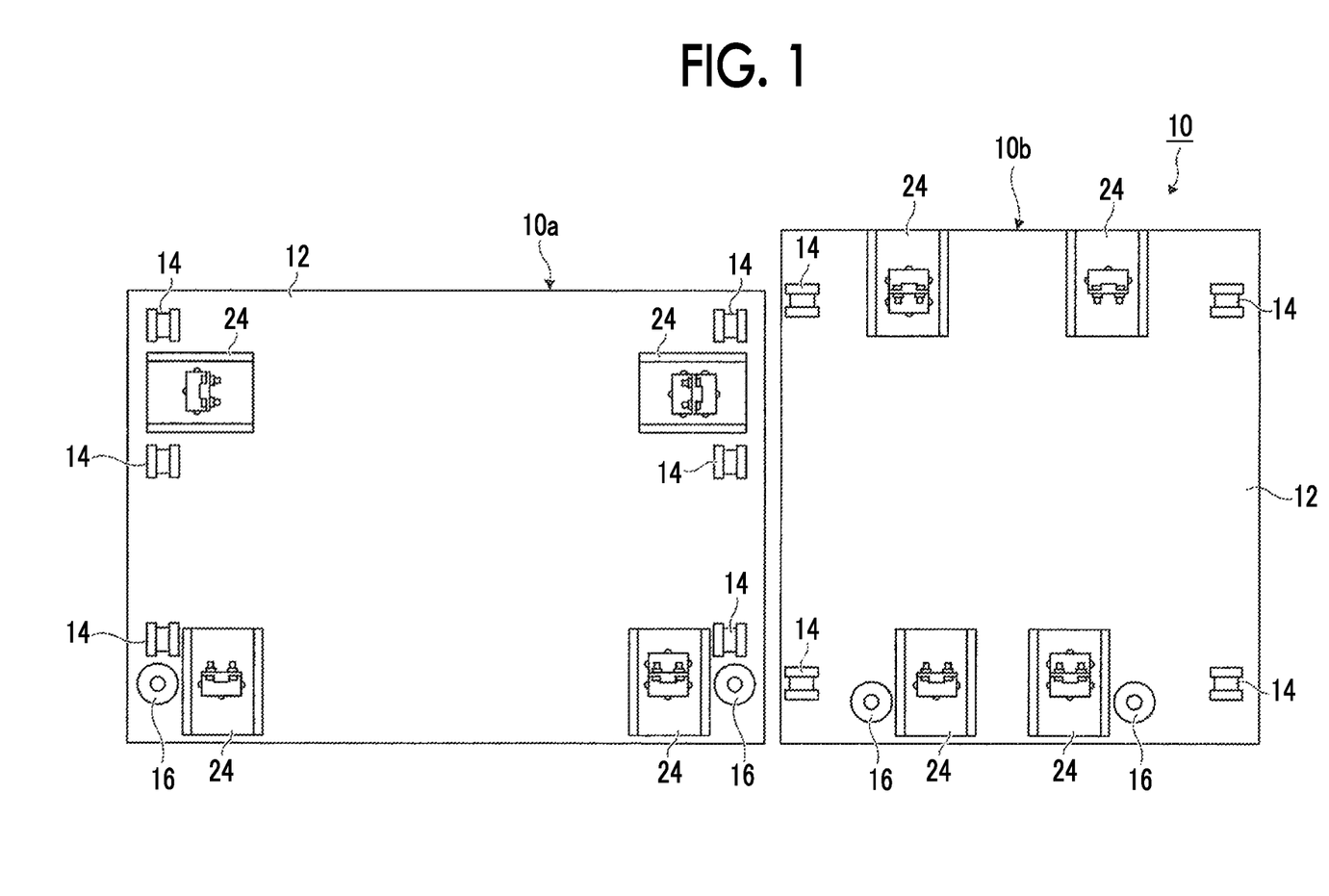
FIG. 1 is a plane view showing a bottom surface of an apparatus having a fixing device according to an exemplary embodiment of the present invention.

FIG. 1 is a plan view showing a bottom surface of an apparatus having a fixing device according to a first exemplary embodiment of the present invention. For example, an apparatus 10 is an image forming apparatus, and a first apparatus 10a and a second apparatus 10b are provided in parallel. Plural casters 14 are provided on each of bottom surfaces of apparatus main bodies 12 of the first apparatus 10a and the second apparatus 10b. When the first apparatus 10a and the second apparatus 10b are moved, the caster 14 is rotated between an installation surface and the caster.

Figure 2:
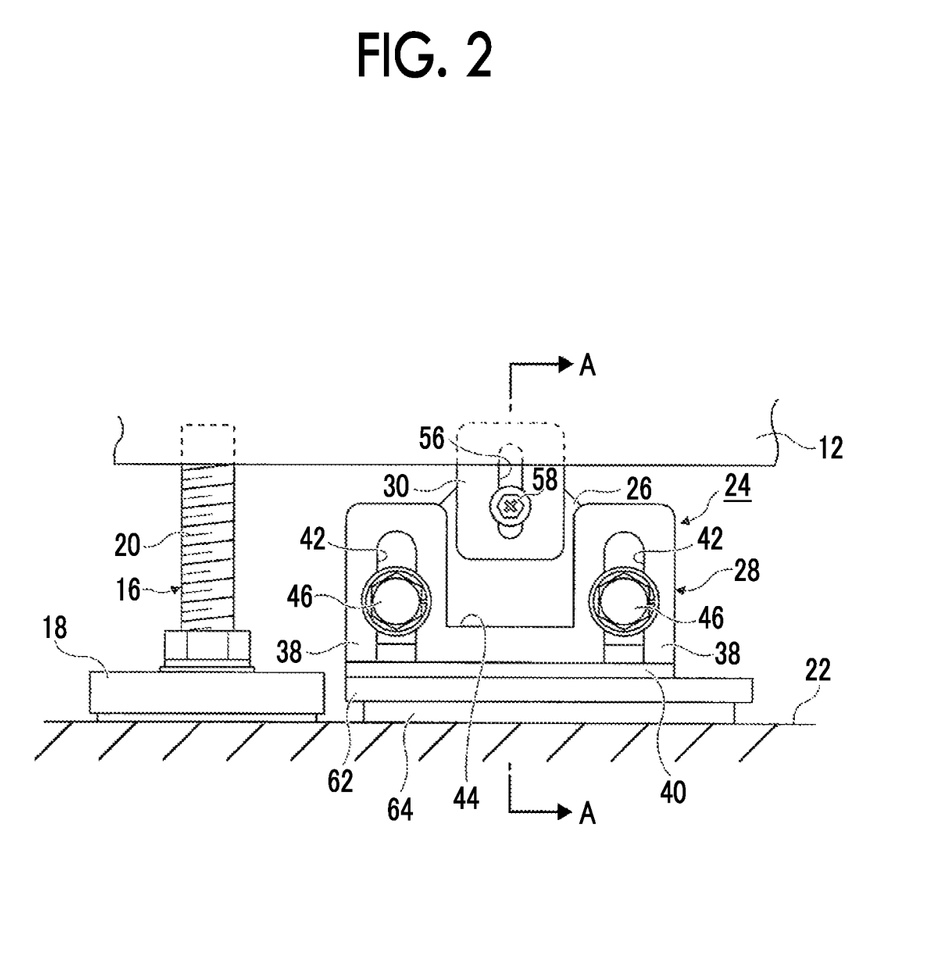
FIG. 2 is a side view showing a fixing structure of an apparatus according to an exemplary embodiment of the present invention.

In addition, plural leg portions (feet) 16 are provided on each of the bottom surfaces of the first apparatus 10a and the second apparatus 10b. As also shown in FIG. 2, the leg portion 16 includes an installation fixing portion 18 and a screw portion 23. The installation fixing portion 18 contacts an installation surface 22 and fixes the first apparatus 10a and the second apparatus 10b to the installation surface 22. The screw portion 20 is screwed to the apparatus main body 12, and may float the installation fixing portion 18 from the installation surface 22 by the rotation of the screw portion.

In addition, for example, four fixing devices 24 are provided on each of the bottom surfaces of the first apparatus 10a and the second apparatus 10b. The fixing device 24 is provided in the vicinity of the caster 14 or the leg portion 16. However, when the apparatus 10 is moved in a state where only the caster 14 contacts the installation surface 22, the fixing device 24 is provided at a position in which the apparatus 10 may avoid the fixing device 24. Moreover, the fixing device 24 is provided in the installation surface 22 to which the bottom surfaces of the first apparatus 10a and the second apparatus 10b are projected. That is, the fixing device 24 is disposed so that a fixing device main body of the fixing device 24 described below does not protrude from the bottom surfaces of the first apparatus 10a and the second apparatus 10b to the side.

When a vertical vibration is generated due to an earthquake or the like, particularly, the fixing device 24 is mounted so as to suppress the apparatus 10 from jumping up and down.

Moreover, in the exemplary embodiment, the apparatus 10 is the image forming apparatus. However, the present invention is not limited thereto and may be applied to a refrigerator, an electric device such as a server, a storage, furniture such as a closet, or the like.

Figure 3:
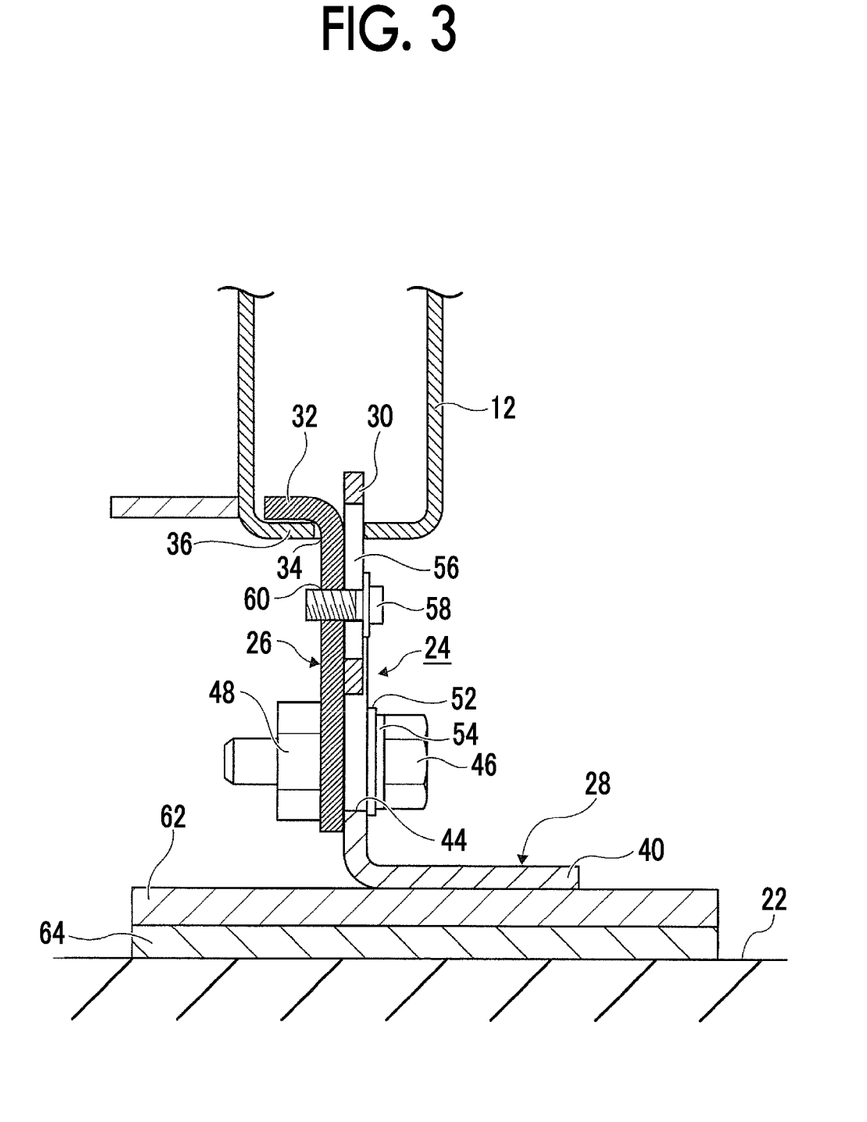
FIG. 3 shows the fixing structure of an apparatus according to the exemplary embodiment of the present invention, and is a cross-sectional view taken along line III-III of FIG. 2.

FIG. 2 is a side view showing a fixing structure of an apparatus according to another exemplary embodiment of the present invention, and FIG. 3 shows the fixing structure of an apparatus according to the exemplary embodiment of the present invention, and is a cross-sectional view taken along line III-III of FIG. 2.

The fixing device 24 includes an engaging member 26, a fixing device main body 28, and a closing member 30.

For example, the engaging member 26 is configured of a planar member made of stainless steel which is formed in an inverted L shape. A portion, which is bent to one side at the tip of the engaging member 26, configures an engaging portion 32 (hook portion). The engaging portion 32 is inserted into an insertion hole 34 which is formed on the apparatus main body 12. For example, the insertion hole 34 is formed in a rectangular shape. An edge of an opening side end of the insertion hole 34 forms an engaged portion 36, and the engaging portion 32 of the engaging member 26 engages with the engaged portion 36.

In addition, the insertion hole 34 is not formed to engage with the engaging member 26 and may use a hole which is formed for manufacture or transport.

For example, the fixing device main body 28 is configured of a planar member made of stainless steel which is formed in an L shape. When the fixing device main body is viewed from the side surface (FIG. 2), both sides become adjustment groove forming portions 38 and stand up vertically from a bottom portion 40. A first adjustment groove 42 is vertically formed on each of the adjustment groove forming portions 38, and first right and left adjustment grooves 42 are parallel with each other. A concave portion 44 is formed between the adjustment groove forming portions 38.

The above-described engaging member 26 and fixing device main body 28 are fixed by a first bolt 46 and a nut 48 which are fixing members. That is, the first bolt 46 is inserted into the first adjustment groove 42 of the fixing device main body 28 and a first bolt insertion hole 50 (shown in FIGS. 4A to 4C) formed on the engaging member 26, and the engaging member 26 and the fixing device main body 28 are interposed between the nut 48. A flat seat 52 and a spring seat 54 are interposed between a head of the first bolt 46 and the fixing device main body 28. Since the first bolt 46 is inserted into the first adjustment groove 42 before the first bolt 46 and the nut 48 are fastened, the engaging member 26 and the fixing device main body 28 are movable vertically, and thus, a mutual vertical direction position between the engaging member 26 and the fixing device main body 28 is adjusted.

For example, the closing member 30 is a planar member made of stainless steel, and a portion of the closing member is disposed in the concave portion 44 of the fixing device main body 28 and contacts the engaging member 26. In the closing member 30, the upper end of the closing member 30 is inserted into the above-described insertion hole 34, and closes a gap generated between the engaged portion 36 and the insertion hole 34 at the side opposite to the engaging portion 32 of the engaging member 26. In the closing member 30, a second adjustment groove 56 is vertically formed.

The closing member 30 is fixed to the engaging member 26 by a second bolt 58. That is, the second bolt 58 is inserted into the second adjustment groove 56 and is screwed to a second bolt insertion hole 60 formed on the engaging member 26. Since the second bolt 58 is inserted into the second adjustment groove 56 before the second bolt 58 is fastened, the engaging member 26 and the closing member 30 are movable vertically, and thus, a mutual vertical direction position between the engaging member 26 and the closing member 30 is adjusted.

The bottom portion 40 of the above-described fixing device main body 28 is fixed to a plate shaped base 62 made of stainless steel by welding or the like, for example. In addition, the base 62 is fixed to the installation surface 22 via an adhesive member 64.

For example, the adhesive member 64 is a visco-elastic member referred to as gel, and may use urethane gel, silicone gel, or the like. The adhesive member 64 generates an adhesion effect by applying pressure between the adhesive member 64 and a member contacting the adhesive member 64.

Figure 4A:
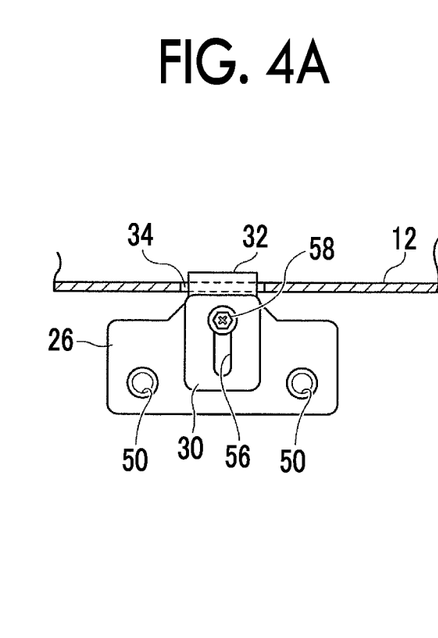
FIGS. 4A to 4C are side views showing a procedure of fixing the apparatus using the fixing device according to the exemplary embodiment of the present invention.
Figure 4B:
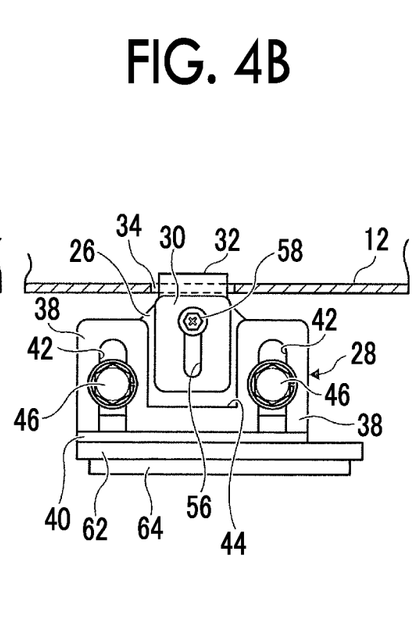
Figure 4C:
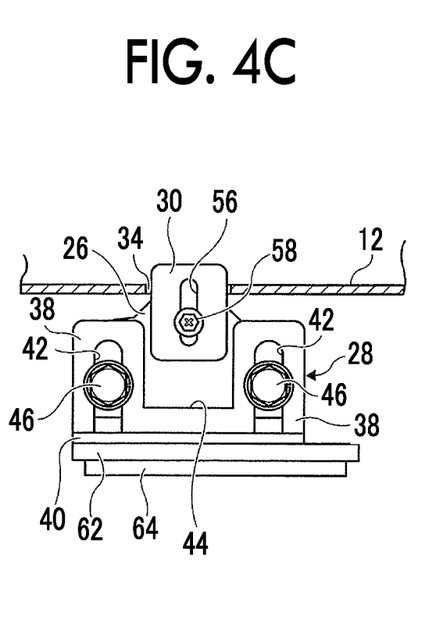

FIGS. 4A to 4C are side views showing a procedure of fixing the apparatus using the fixing device 24.

First, as shown in FIG. 4A, the engaging portion 32 of the engaging member 26, to which the closing member 30 is temporarily fixed in advance, is inserted into the insertion hole 34 of the fixing device main body 28, and the engaging portion 32 of the engaging member 26 is hooked to the engaged portion 36 of the fixing device main body 28. Since the engaging portion 32 is not fixed to the engaged portion 36 of the fixing device main body 28 by fastening or the like, the engaging member 26 is supported to the fixing device main body 28 to be rotatable about the engaging portion 32 with respect to the fixing device main body 28. In addition, as temporary fixing, the engaging portion 32 and the engaged portion 36 may be bonded to each other by a double sided tape or the like.

Next, as shown in FIG. 4B, the apparatus is moved so that the first adjustment groove 42 of the fixing device main body 28 which is fixed to the installation surface 22 in advance by the adhesive member 64 and the first bolt insertion hole 50 of the engaging member 26 coincide with each other. When the apparatus is moved, the leg portions 16 float from the installation surface 22. Next, the first bolt 46, on which the flat seat 52 and the spring seat 54 are mounted, is inserted into the first adjustment groove 42 of the fixing device main body 28 and the first bolt insertion hole 50 of the engaging member 26, and is temporarily fixed. Subsequently, the position between the fixing device main body 28 and the engaging member 26 is minutely adjusted, the first bolt 46 is fastened by the nut 48, and the fixing device main body 28 and the engaging member 26 are fixed to each other. Since two grooves are parallel to each other in the first adjustment grooves 42, the entire fixing device main body 28 is vertically moved in a state where the base 62 is maintained to be parallel.

Here, since the engaging member 26 is supported to the apparatus main body 12 to be rotatable about the engaging portion 32 before the first bolt 46 is fastened by the nut 48, the engaging portion 32 is rotated even when the apparatus main body 12 and the installation surface 22 are inclined, and thus, the engaging member 26 and the fixing device main body 28 match with each other. Accordingly, the adhesive member 64 does not need to be adjusted in the press direction when the first bolt 46 is fastened by the nut 48, and thus, the first bolt 46 and the nut 48 may be easily fastened.

Next, as shown in FIG. 4C, the closing member 30 is lifted up and the upper portion of the closing member 30 is inserted into the insertion hole 34, the gap of the insertion hole 34 is closed, and the closing member 30 is fixed to the engaging member 26 by fastening the second bolt 58. Accordingly, the engaging portion 32 of the engaging member 26 is prevented from being deviated from the engaged portion 36.

Thereafter, the installation fixing portion 18 of the leg portion 16 is grounded to the installation surface 22.

In addition, when the fixing by the fixing device 24 is released, the above-described procedure may be performed in reverse. In this case, when the closing member 30 is removed from the insertion hole 34 and the connection between the engaging member 26 and the fixing device main body 28 is released, it is possible to move the apparatus without removing the fixing device main body 28 from the installation surface 22.

In addition, when the engaging portion 32 and the engaged portion 36 are temporarily fixed to each other by a double sided tape or the like, the adhesion is necessary to be an extent capable of removing the temporary fixing between the engaging portion 32 and the engaged portion 36 by human power.

In this way, in the engaging member 26, fixing such as fastening or welding is not performed on the apparatus main body 12. Even if a gap is generated between the engaging portion 32 and the engaged portion 36, when the apparatus 10 is moved up, the engaging portion 32 contacts the engaged portion 36, and thus, the apparatus 10 is suppressed from being moved up.

In addition, in the first apparatus 10a, directions of two fixing devices 24 are changed by 90° with respect to directions of two other fixing devices 24. That is, there are two directions in the longitudinal direction of the insertion hole 34. In this way, since the direction of the fixing device 24 is set to two, shaking in both forward and rearward directions and both right and left directions is prevented.

Figure 5:
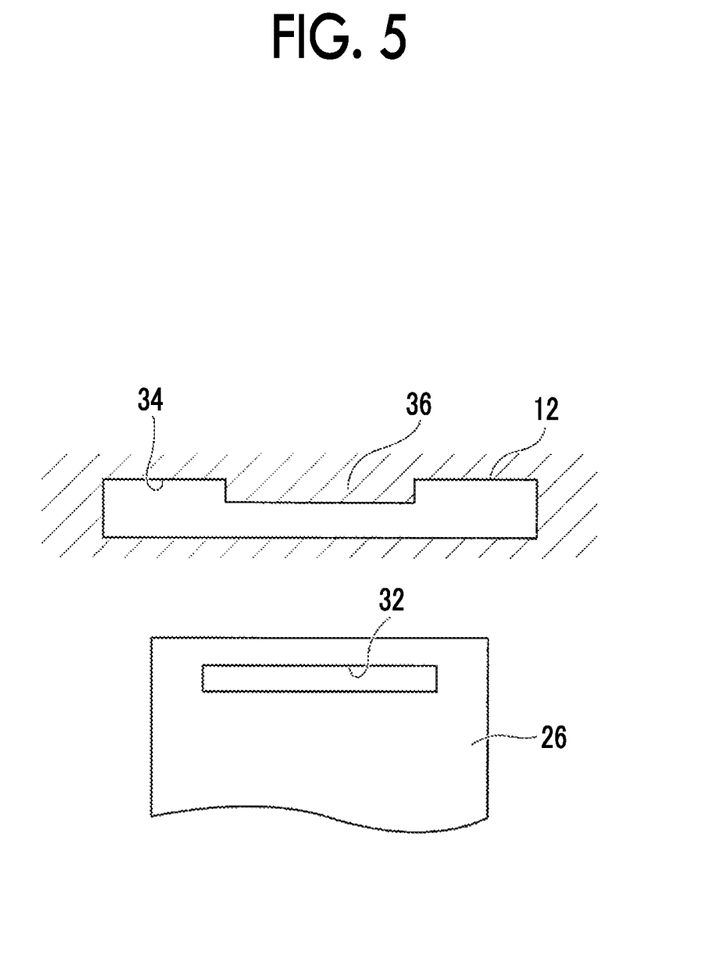
FIG. 5 is a plan view showing an insertion hole and a side view showing an engaging member according to a second exemplary embodiment of the present invention.

FIG. 5 is a plan view showing an insertion hole and a side view showing an engaging member according to a second exemplary embodiment of the present invention.

In the second exemplary embodiment, the engaged portion 36 of the apparatus main body 12 is formed as a protrusion which protrudes to the opening side of the insertion hole 34.

Meanwhile, the engaged portion 36 of the engaging member 26 is formed as a rectangular hole. The engaging portion 32 is formed to be slightly larger than the perimeter of the engaged portion 36, and the engaging portion 32 engages with the engaged portion 36. Compared to the above-described exemplary embodiment, in the above-described exemplary embodiment, only the down direction in the vertical direction of the engaging member 26 is regulated. However, in the second exemplary embodiment, two up and down directions in the vertical direction of the engaging member 26 are regulated.

Figure 6:
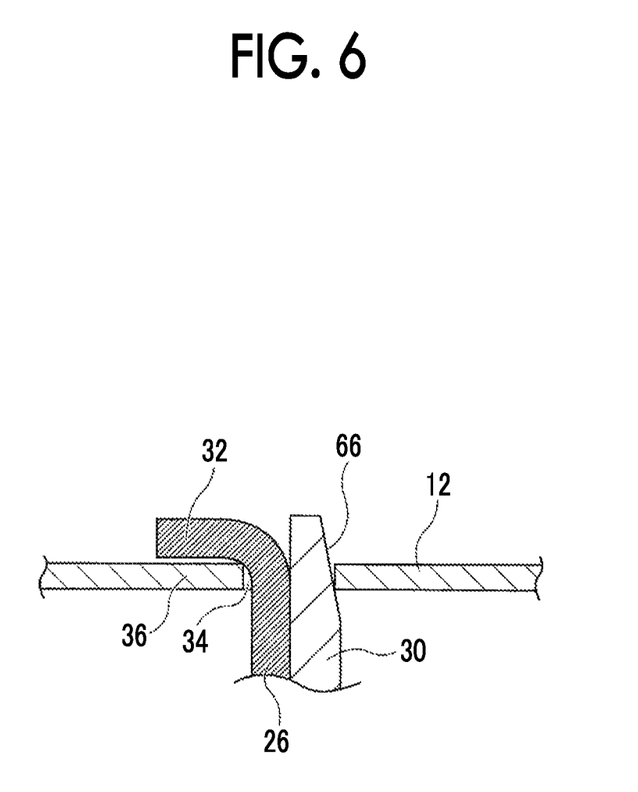
FIG. 6 is a cross-sectional view showing a relationship between an engaging member and a closing member according to a third exemplary embodiment of the present invention.

FIG. 6 is a cross-sectional view showing a relationship between an engaging member and a closing member according to a third exemplary embodiment of the present invention. In the third exemplary embodiment, a side opposite to the engaging member in the upper portion of the closing member 30 becomes an inclined surface and forms a pressing portion 66. When the pressing portion 66 is inserted into the insertion hole 34 of the engaging member 26, the pressing portion 66 decreases the possibility of collision between the tip of the engaging member 26 and the edge of the insertion hole 34, abuts the side of the insertion hole 34 opposite to the engaging member after the engaging member 26 is inserted into the insertion hole 34, and presses the engaging member 26 to the engaged portion 36 side.

In addition, the closing member 30 according to the third exemplary embodiment of the present invention is made of rubber having an elastic force, and the shaking of the apparatus 10 is suppressed by the elastic force of the closing member 30 even when the apparatus 10 is shaken due to an earthquake or the like. Moreover, also in the first and second exemplary embodiments, the closing member 30 made of rubber may be used.

Moreover, in the exemplary embodiments, the fixing device main body 28 and the installation surface 22 are fixed to each other via the adhesive member 64. However, the present invention is not limited thereto, and for example, the fixing device main body 28 and the installation surface 22 may be fixed to each other via a bolt.

In addition, in the exemplary embodiments, the insertion hole 34 is formed in a rectangular shape. However, the insertion hole 34 may be formed in a slit shape which is a gap extended linearly. When the insertion hole 34 has a slit shape, the fixing device 24 may be fixed to the installation surface 22 at an arbitrary position.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:
1. A fixing device comprising:
an engaging member that includes a hook portion that is inserted into a hole provided in the apparatus and is hooked to an edge of the hole, and is configured of a planar member;
a fixing portion that is fixed to the engaging member and is fixed to an installation surface on which the apparatus is installed; and
a closing portion that is fixed to the engaging member so that a position of the closing portion is adjustable, closes the hole by being inserted into the hole, and is configured of the planar member,
wherein the engaging member is fixed to the fixing portion so that a position of the engaging member is adjustable by a plurality of grooves that are provided on the fixing portion and are parallel to one another and by a fixing member inserted into a groove of the plurality of grooves,
wherein the hook portion and the closing portion are disposed between the plurality of grooves, and
wherein the fixing portion and the closing portion are disposed on a same side surface of the engaging member that is configured of the planar member.
2. The fixing device according to claim 1, wherein the closing portion closes a gap formed between the edge of the hole opposite to the edge to which the hook portion is hooked, and the hook portion.
3. The fixing device according to claim 1, wherein the closing portion is provided with a groove, the closing portion is fixed to the engaging member by a second fixing member inserted into the groove, and the second fixing member moves within a range of the groove so that the position of the closing portion is adjustable.
4. The fixing device according to claim 2, wherein the closing portion is provided with a groove, the closing portion is fixed to the engaging member by a second fixing member inserted into the groove, and the second fixing member moves within a range of the groove so that the position of the closing portion is adjustable.
5. The fixing device according to claim 1, wherein an inclined surface is formed, so that a gap of the hole is gradually narrowed as the closing portion is inserted thereinto, at an end of a side to be inserted into the hole of the closing portion.
6. The fixing device according to claim 2, wherein an inclined surface is formed, so that a gap of the hole is gradually narrowed as the closing portion is inserted thereinto, at an end of a side to be inserted into the hole of the closing portion.

7. The fixing device according to claim 3,
wherein an inclined surface is formed, so that a gap of the hole is gradually narrowed as the closing portion is inserted thereinto, at an end of a side to be inserted into the hole of the closing portion.

8. The fixing device according to claim 1, wherein the closing portion has an elastic force.

9. The fixing device according to claim 2, wherein the closing portion has an elastic force.

10. The fixing device according to claim 3, wherein the closing portion has an elastic force.

11. The fixing device according to claim 4, wherein the closing portion has an elastic force.

12. The fixing device according to claim 5, wherein the closing portion has an elastic force.

13. A fixing structure of an apparatus comprising:
an apparatus main body on which a hole is formed; and
a fixing device that fixes the apparatus main body to an installation surface,
the fixing device including:
an engaging member that includes a hook portion that is inserted into a hole provided in the apparatus and is hooked to an edge of the hole, and is configured of a planar member;
a fixing portion that is fixed to the engaging member and is fixed to the installation surface on which the apparatus is installed; and
a closing portion that is fixed to the engaging member so that a position of the closing portion is adjustable, closes the hole by being inserted into the hole, and is configured of the planar member,
wherein the engaging member is fixed to the fixing portion so that a position of the engaging member is adjustable by a plurality of grooves that are provided on the fixing portion and are parallel to one another and by a fixing member inserted into a groove of the plurality of grooves,
wherein the hook portion and the closing portion are disposed between the plurality of grooves, and
wherein the fixing portion and the closing portion are disposed on a same side surface of the engaging member that is configured of the planar member.

14. The fixing structure of an apparatus according to claim 13,
wherein the fixing portion is provided in the installation surface to which a bottom surface of the apparatus is projected.

15. The fixing structure of an apparatus according to claim 13, wherein
the closing portion closes a gap formed between the edge of the hole opposite to the edge to which the hook portion is hooked, and the hook portion.

16. The fixing structure of an apparatus according to claim 14, wherein
the closing portion closes a gap formed between the edge of the hole opposite to the edge to which the hook portion is hooked, and the hook portion.

17. The fixing structure of an apparatus according to claim 13, wherein
the closing portion is provided with a groove,
the closing portion is fixed to the engaging member by a second fixing member inserted into the groove, and
the second fixing member moves within a range of the groove so that the position of the closing portion is adjustable.

18. The fixing structure of an apparatus according to claim 14, wherein
the closing portion is provided with a groove,
the closing portion is fixed to the engaging member by a second fixing member inserted into the groove, and
the second fixing member moves within a range of the groove so that the position of the closing portion is adjustable.

19. The fixing structure of an apparatus according to claim 15, wherein
the closing portion is provided with a groove,
the closing portion is fixed to the engaging member by a second fixing member inserted into the groove, and
the second fixing member moves within a range of the groove so that the position of the closing portion is adjustable.

20. A fixing method of an apparatus comprising:
inserting a hook portion, which is provided on an engaging member configured of a planar member, into a hole provided in an apparatus, and hooking the hook portion to an edge of the hole;
installing a fixing portion on an installation surface on which the apparatus is installed;
adjusting positions of the fixing portion and the engaging member by grooves, which are provided on the fixing portion and are provided to be parallel to one another, and a fixing member inserted into the groove, and fixing the fixing portion and the engaging member;
inserting a closing member, which has a position which is adjustable with respect to the engaging member and is configured of a planar member, into the hole disposed between the plurality of grooves, and closing the hole; and
fixing the engaging member and the closing portion.

* * * * *